(12) United States Patent
Bengtsson

(10) Patent No.: US 6,909,272 B2
(45) Date of Patent: Jun. 21, 2005

(54) SYSTEM AND METHOD FOR VOLTAGE DIVIDER HAVING A GUARD STRUCTURE

(75) Inventor: Bjorn Bengtsson, Taby (SE)

(73) Assignee: General Electric Company, Schenectady, NY (US)

( * ) Notice: Subject to any disclaimer, the term of this patent is extended or adjusted under 35 U.S.C. 154(b) by 334 days.

(21) Appl. No.: 09/987,991

(22) Filed: Nov. 16, 2001

(65) Prior Publication Data

US 2003/0098698 A1 May 29, 2003

(51) Int. Cl.$^7$ .............................................. G01R 27/26
(52) U.S. Cl. ...................................... 324/126; 324/688
(58) Field of Search ................................ 324/127, 126, 324/688, 691, 681, 676; 361/38, 93.5; 327/536

(56) References Cited

U.S. PATENT DOCUMENTS 4,034,283 A * 7/1977 Pellegrino .................. 323/370
5,181,026 A * 1/1993 Granville ................ 340/870.28
5,966,425 A * 10/1999 Beland ........................ 378/108

\* cited by examiner

*Primary Examiner*—Jay Patidar
*Assistant Examiner*—Amy He
(74) *Attorney, Agent, or Firm*—Hunton & Williams LLP

(57) ABSTRACT

A voltage divider (102) for high voltage and other applications uses a high voltage impedance element (104) and a low voltage impedance element (106) to isolate a sample node (110) from which to measure current, voltage, frequency response and other characteristics. The high voltage impedance element (104) includes a resistive network for reducing high voltages, for instance power line voltages of 20 kV or more, down to instrument levels to take measurements on insulation or other materials. The high voltage impedance element (104) is surrounded by one or more capacitive guard elements (118) which shunt stray capacitive currents to ground, improving frequency response and other characteristics. The voltage divider (102) be connected to a current receiver (112) for purposes of instrumentation.

60 Claims, 16 Drawing Sheets

Divider with current receiver.

Unbuffered divider.

Cross-sectional view of four circuit boards in a divider stack

SYSTEM AND METHOD FOR VOLTAGE DIVIDER HAVING A GUARD STRUCTURE

FIELD OF THE INVENTION

The invention relates to the field of electrical power measurement, and more particularly to a high-precision voltage divider having a guard structure capable of reducing power line voltages to instrument plug levels while maintaining stable phase and high linearity.

BACKGROUND OF THE INVENTION

The power and other industries require precision measurements of cables and other electrical distribution components for safety, maintenance and other purposes. One such application is the measurement of the performance of the insulation on long haul power cabling, to test that insulation for faults, cracks, water damage and other faults and characteristics. That insulation might be, for instance, cross-linked polyethylene (XLPE) or other material used in medium or high voltage or other electrical distribution lines.

The voltages carried by distribution cables may be generally in the range of several thousand volts (kilovolts, kV) or more, whereas the input voltages accepted by measuring instruments used to test the impedance and other parameters of the cabling may be generally in the low voltage range of 10 volts or less. A conventional way of reducing the applied voltage to make measurements of insulation or other material is therefore to interpose a voltage divider in the test circuit to normalize the voltages on the instrument probes. A representation of a conventional voltage divider is show in FIG. 1. However, manufacturing a high voltage divider that works enough precision to make high-resolution measurements on impedance or other quantities has not been an easy problem to solve.

A general design problem with dividers in the high voltage regime is that combining adequate DC and AC characteristics is difficult. For diagnostic measurements of electrical power equipment, frequencies in the range of direct current to 100 Hz may be of interest. A resistive divider can yield high accuracy at DC, but the accuracy of that type of circuit is reduced at AC. The opposite is true for a capacitive divider. Mixed dividers can be used for both DC and AC, but they have a transition range that gives stability problems In the past, high voltage circuits, including dividers, have typically employed heavy duty components such as thick film resistors and compressed gas capacitors. Those types of parts have been chosen since they can withstand electric voltages of 20 kV or other high voltage lines. However, that grade of component typically suffers from comparatively inferior phase shift stability, linearity and temperature stability, among other disadvantages. These performance characteristics reduce the precision with which insulation or other samples may be tested using a voltage divider built with such components.

Low voltage components, on the other hand, typically exhibit better phase shift stability, linearity and temperature stability than high voltage counterparts. Low voltage components may include, for example, thin film metal resistors and film capacitors, such as polypropylene capacitors. However, these types of parts are generally not built to withstand the relatively intense electric fields carried by distribution grade electric cables. Overheating, arcing, frequency response and other problems may occur. Without modification, these parts are therefore not good candidates for use in high voltage divider designs.

These and other problems exist in designing a precision high voltage divider.

SUMMARY OF THE INVENTION

The invention overcoming these and other problems in the art relates in one regard to a system and method for a high precision, high voltage divider which includes a reductive high voltage impedance element coupled with a capacitive guard to achieve phase stability, temperature stability, high precision in the voltage magnitude (divider ratio) and resulting high measurement accuracy. The capacitive guard serves to drain stray capacitive currents to ground, maintaining better voltage uniformity along the axis of the divider. The divider of the invention may in one embodiment be assembled from multiple, series-connected low voltage components which provide an aggregate resistive load sufficient to divide high power line voltages down to instrument levels, while preserving phase, frequency and other response characteristics.

BRIEF DESCRIPTION OF THE DRAWINGS

The invention will be described with reference to the accompanying drawings, in which like elements are labeled with like numerals.

DETAILED DESCRIPTION OF PREFERRED EMBODIMENTS

Figure 1:
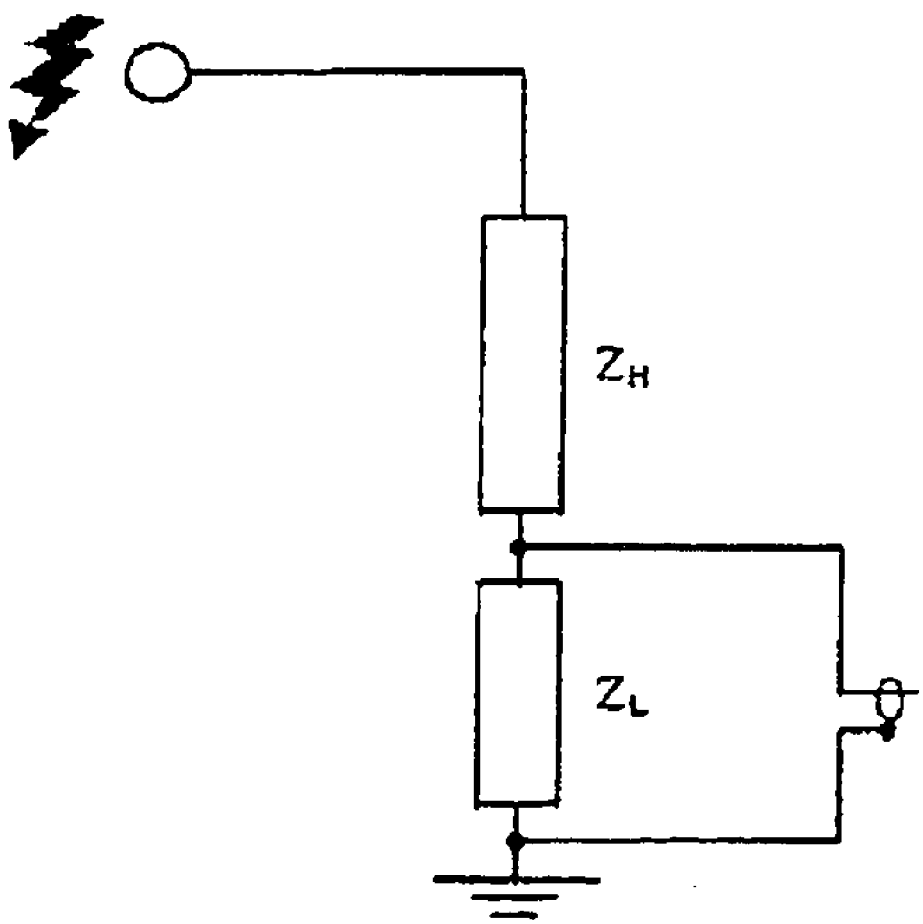
FIG. 1 illustrates a conventional voltage divider circuit
Figure 2:
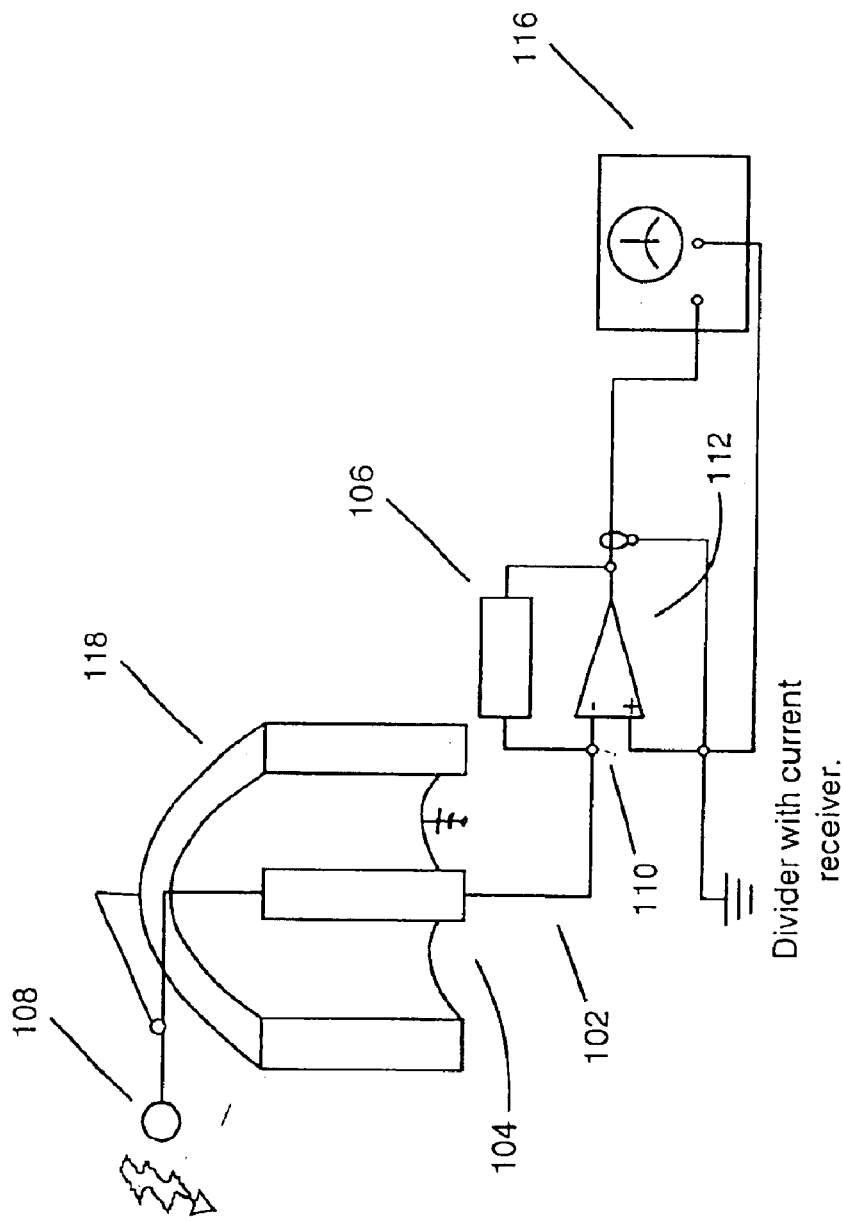
FIG. 2 illustrates a voltage divider according to an embodiment of the invention, including a guard element.

A voltage divider 102 according to an embodiment of the invention is illustrated in FIG. 2. As shown in that figure, the voltage divider 102 generally includes a high voltage impedance element 104 and a low voltage impedance element 106. The high voltage test signal, such as a 20 kV power load at up to 100 Hz or other signals, is presented at an input node 108. That signal is divided and sampled at a sample node 110 between the high voltage impedance element 104 and the low voltage impedance element 106. The sample node 110 in turn is connected to a current receiver 112, to which a measurement instrument 116, such as meters, oscilloscopes or others may be attached.

Frequency response in this embodiment is protected because the low voltage impedance element 106 is not loaded in a configuration terminating in the current receiver 112. A current receiver 112 may thus be used to obtain high stability on the measurement end, but in different embodiments other input circuits to the measurement instrument 116 may be used. In the embodiment illustrated in FIG. 2, no voltage potential may be present at sample node 110, but the current flowing through sample node 110 is a representation of the voltage at the input node 108. The current receiver 112 may convert the sampled current to a direct, scaled down voltage representation of the original input signal.

The measurement instrument 116 may detect voltage, current, frequency, phase and other quantities, for instance to measure the complex impedance of cable insulation or other material, act as a high accuracy watt meter, or perform other diagnostics.

As discussed above, conventional divider techniques are not suitable for precision operation from DC to power line frequencies with the accuracy objectives of the invention. A capacitive divider might be contemplated, but this implies that a polymer film capacitor must be used in the low voltage element which would introduce a temperature drift that exceeds the temperature drift of the high voltage capacitor. That approach might also introduce difficulties with the low frequency and DC accuracy.

The voltage divider 102 of the invention therefore adopts a resistive configuration for the high voltage impedance element 104. However, it is difficult to get a resistive divider to work on power line frequencies of up to 100 Hz with high phase accuracy because stray capacitances in combination with high ohmic elements distort the frequency response. In the implementation described below the high voltage impedance 104 may present a net resistance of at least 200 MΩ. Because of this high resistance, even a small stray capacitance from the voltage divider 102 to ground will load the voltage divider 102 at 100 Hz sufficiently to distort frequency response, phase and other characteristics beyond useful tolerances. These difficulties are further complicated by the fact that the stray capacitances in the voltage divider 102 may be significant, since the voltage divider 102 may incorporate a metallic shield for mechanical protection.

The invention consequently employs certain adaptations to a purely resistive approach to preserve frequency response and other performance measures, even using low voltage parts.

The voltage divider 102 of the invention therefore includes not only a high voltage impedance element 104 and a low voltage impedance element 106, but a guard element 118 operating in conjunction with and in the current path of high voltage impedance element 104. The guard element 118 may be a conducting capacitor, group of capacitors or other capacitive element surrounding the high voltage impedance element 104 and connected to ground. The guard element 118 may act to shunt stray capacitive currents to ground, rather than permitting stray currents to randomly diffuse from along the axis of the high voltage impedance element 104 to ground. In embodiments of the invention, the voltage divider 102 may be encased within a metallic or other shield 120 for structural support and electrical integrity.

The voltage drops across the stray capacitances are therefore significantly reduced, and leakage current from the high voltage impedance element 104 due to those voltage drops is therefore correspondingly reduced. Frequency response, phase linearity and other performance characteristics of the voltage divider 102 are enhanced due to the protective effect of the guard element 118.

Figure 3:
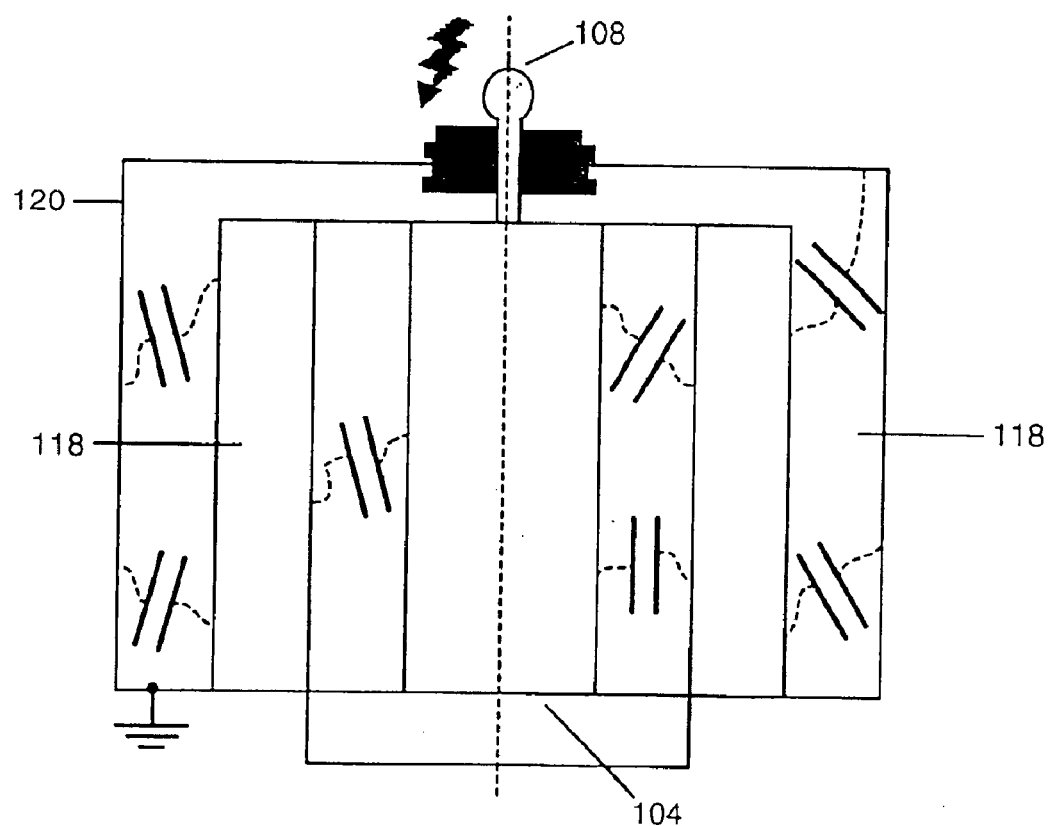
FIG. 3 illustrates a voltage divider according to another embodiment of the invention.

As illustrated in FIG. 3, in an embodiment of the invention the high voltage impedance element 104 may be constructed inside a coaxial structure that has a field distribution equal to the field generated by the element itself. As illustrated in FIG. 3, in this embodiment this may include the high voltage impedance element 104 which is surrounded by the guard element 118, which acts as a capacitive impedance that draws more current at higher frequencies and thus maintains a near ideal voltage distribution across the length of voltage divider 102.

It may be noted that the guard element 118 itself may exhibit stray capacitances that may leak current to ground. Therefore the capacitance in the guard element 118 may preferably be chosen to be significantly larger than the expected stray capacitances to be able to supply the leakage current without much voltage drop across the guard element 118. Ideally, there would be no radial electric field component in the area between the high voltage impedance element 104 and the guard element 118, meaning that no capacitive leakage current could flow.

Figure 4:
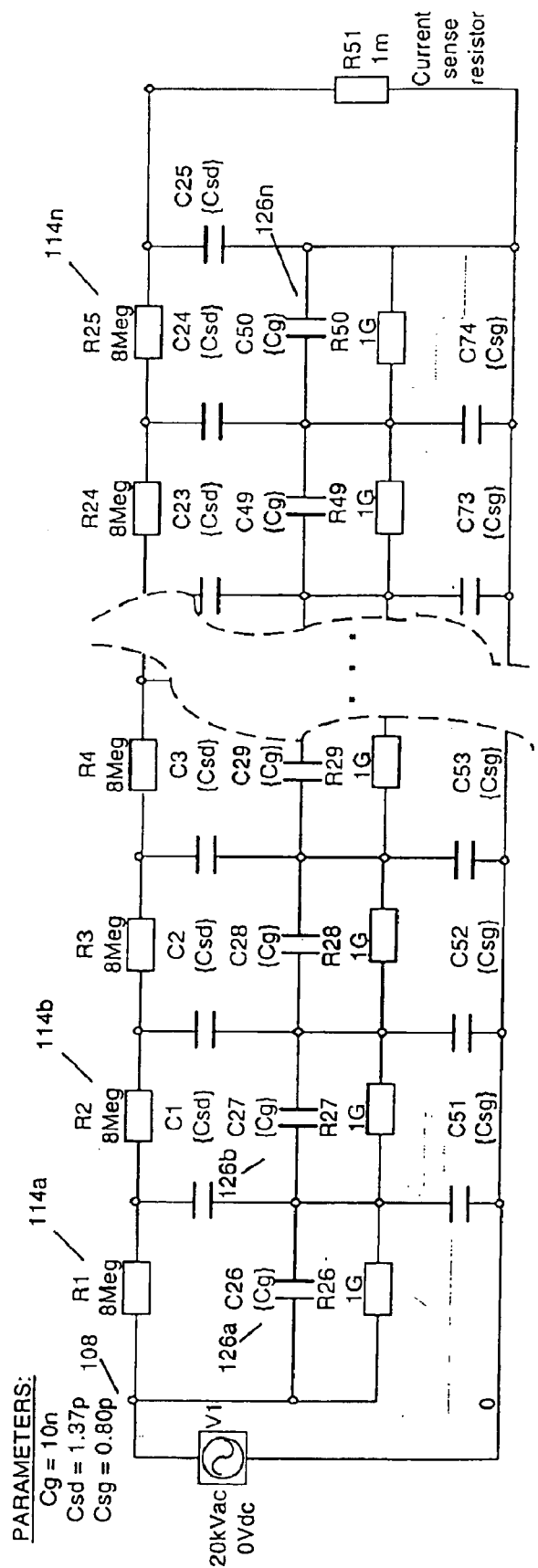
FIG. 4 illustrates a voltage divider according to another embodiment of the invention.

FIG. 4 illustrates an implementation of a high voltage impedance element 104 operating with a guard element 118, using discrete components. As illustrated in this figure, in embodiments the high voltage impedance element 104 may be constructed from multiple resistive elements 114a, 114b . . . 114n (n arbitrary) to reduce power line or other high voltage signals for sampling at the sample node 110. According to an embodiment of the invention, the resistive elements 114a, 114b . . . 114n may be or include precision metal film resistors, such as Philips MPR24 1 MΩ parts, those manufactured by Roderstein, or others.

The high voltage impedance 104 may in one embodiment, for example, consist of a set of series-connected 1 MΩ thin film resistors as resistive elements 114a, 114b . . . 114n. If built with individual resistors having a maximum voltage tolerance of 250V, the requirement for an input voltage range of, for example, 20 kV may be met by 200 resistors connected in series. In such an implementation, the high voltage impedance 104 has a resulting resistance of 200 MΩ. Likewise, although illustrated as a single part, low voltage impedance element 106 may consist of or include multiple resistors or other elements. Other part selections and values are possible.

The guard element 118 in this illustration may be constructed from a series of capacitors, C26–C50 and resistors, R26–R50 (which in implementation are physical components). The resistors may be used to compensate for the spread in leakage currents between the capacitors which otherwise could give a voltage distribution at DC that exceeds the maximum voltage rating of an individual capacitor. As illustrated in FIG. 4, in embodiments of the invention the guard element 118 may be constructed from a set of individual capacitors 126a, 126b . . . 126n (n arbitrary) to achieve desired capacitive and other values.

The capacitances C1–C25 represent the modeled stray capacitance from the resistive element to the guard (which are not physical components). C51–C74 represent the modeled stray capacitances from the guard to the shield 120 (again not physical components).

Figure 5:
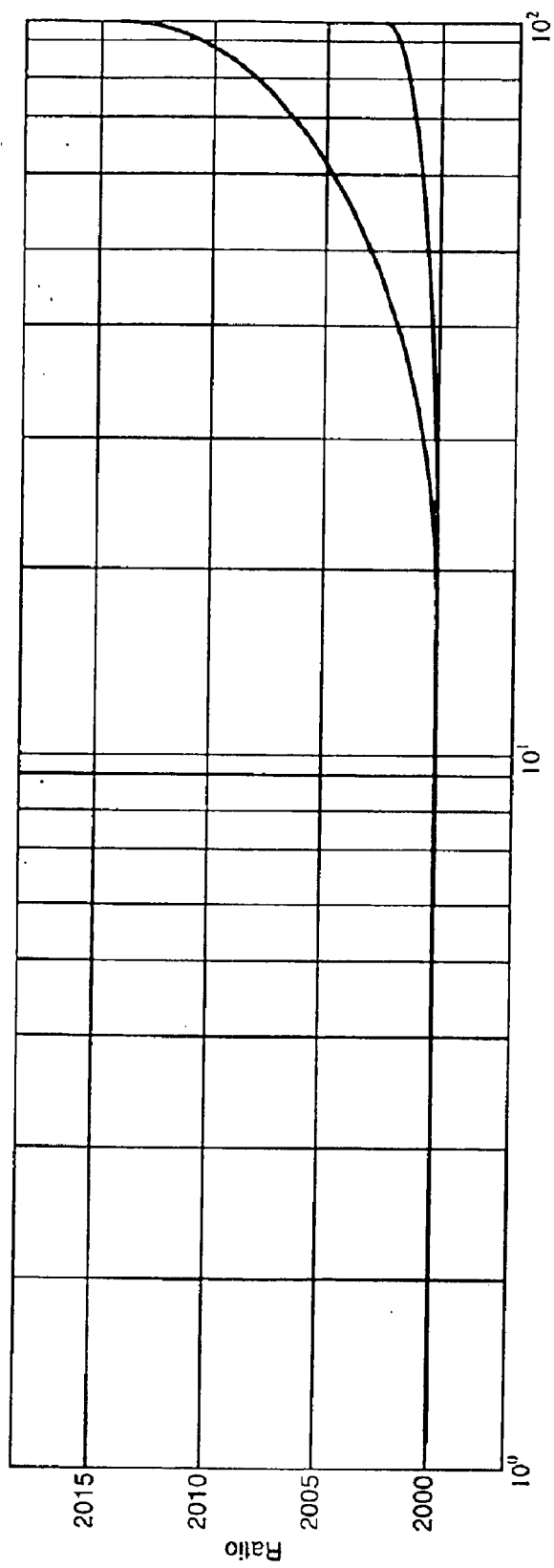
FIG. 5 illustrates a modeled frequency response of a circuit according to an embodiment of the invention.
Figure 6:
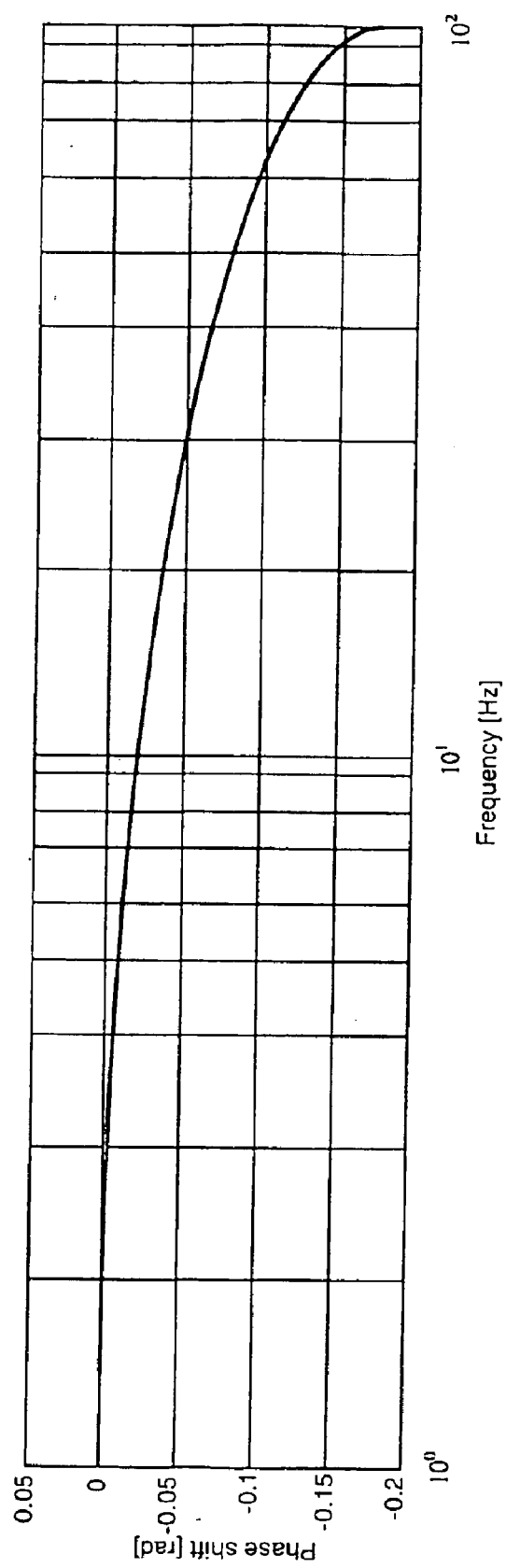
FIG. 6 illustrates a modeled frequency response of a circuit according to an embodiment of the invention, in another regard.

A frequency response simulation for the modeled circuit of FIG. 4 is shown in FIGS. 5 and 6. In the modeling, performed in part using the PSpice software package commercially available from Cadence Design Systems, Inc. and using the FEMLAB software package commercially available from Comsol, Inc. to model stray capacitances, each of the 25 sections of the high voltage impedance 104 consists of a 10 nF capacitor in parallel with a 1 GΩ resistor illustrated in FIG. 4. The resistance of the voltage divider 102 is illustratively selected to be 200 MΩ. The high voltage impedance element 104 is fitted with an ideal low voltage part to give a divider with a nominal ratio of 2000. The stray capacitances per section are modeled as:

| Element/guard: | 34.3 pF/25 = 1.37 pF |
| Guard/shield: | 20.1 pF/25 = 0.80 pF |

The solid curves in FIG. 5 illustrate a simulated frequency response of the voltage divider 102. This can be compared with the response of a voltage divider without a guard element, which is plotted with dashed curves.

As illustrated in FIG. 6, the simulation reveals that a significant improvement in the absolute phase shift of the voltage divider 102 according to the invention may be achieved. That measure is down to −3.4 mrad. This can be compared with the −180 mrad of an unguarded divider. The ratio bandwidth is also improved. The ratio at 100 Hz is 2003.1, which gives an error of 0.16%. The error in the unguarded divider is 0.7%. A voltage divider 102 according to the invention may therefore meet the frequency response requirements for cable and other testing. However, as showed in the graphs of FIG. 5 and FIG. 6, the requirements are met but not greatly exceeded.

Therefore, in another embodiment of the invention, the inventive design may be extended even further to improve the frequency and other characteristics of the voltage divider 102. Ideally, the potential on the guard element 118 should drop linearly down the voltage divider 102, the same way the potential decreases along a homogenous resistive element. It may be inferred that much of the remaining phase shift and ratio errors reflected in the simulations described above may be due to imperfections in the guard element 118. Those imperfections may include the phenomena that voltage potential along the guard element 118 may not be uniformly equal to the potential at the adjacent point on the high voltage impedance element 104. Thus a current may be driven through the stray capacitance, causing the frequency response of the voltage divider 102 to deteriorate.

Figure 7:
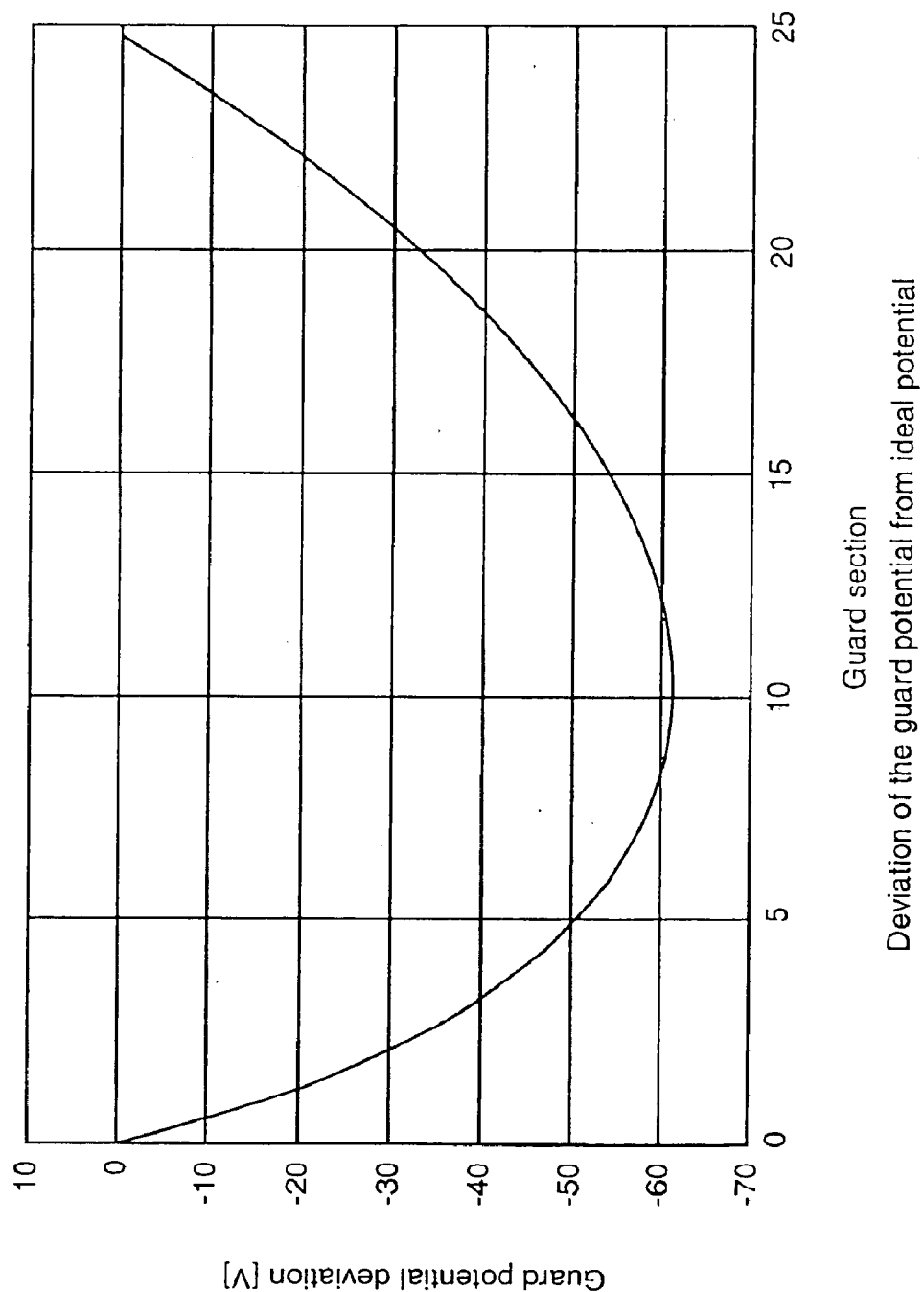
FIG. 7 illustrates a simulation of an internal voltage drop according to an embodiment of the invention.

Further exploring this phenomena, FIG. 7 illustrates a simulation of the internal voltage in voltage divider 102 described in the embodiment above. The deviation of the potential on the guard element 118 from the ideal potential is plotted, i.e. the voltage between adjacent points on the guard element 118 and the high voltage impedance element 104. Section 0, to the left in the graph, corresponds to the high voltage electrode, section 25 is ground. The potential is taken at the lower side of the C1–C25 stray capacitances shown in the model of FIG. 4.

It may be seen that the maximum voltage deviation in the guard element 118 is around 63 Volts (deviation from ideal voltage, which is linear along the sections.) The maximum occurs at section 11, slightly above the center of the voltage divider 102. Again, the voltage drop is caused by loading from the stray capacitance to the shield 120. If this voltage is reduced, the frequency response of the voltage divider 102 may be improved. One conceivable way to reduce the unwanted voltage drop is to increase the capacitance of the guard element 118. However, this would increase the load on the measurement instrument 116.

Figure 8:
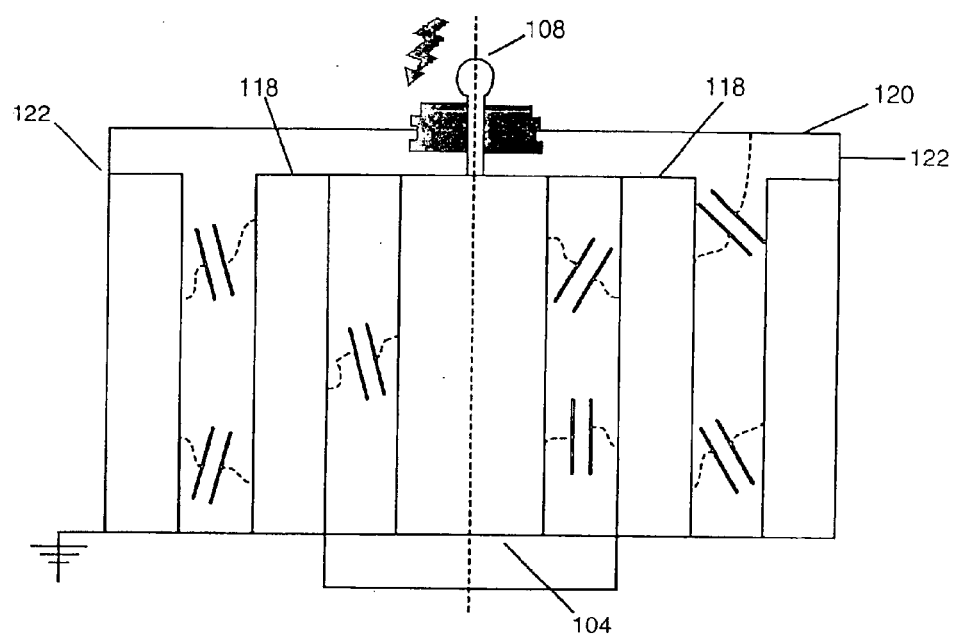
FIG. 8 illustrates a voltage divider according to another embodiment of the invention, including two guard elements.

Accordingly, according to embodiment of the invention illustrated in FIG. 8, a voltage divider 102 may generally incorporate a second, outer guard element 122 to protect the guard element 118. The outer guard element 122 may be generally constructed in a similar configuration to the guard element 118, but mounted coaxially around the guard element 118.

Figure 9:
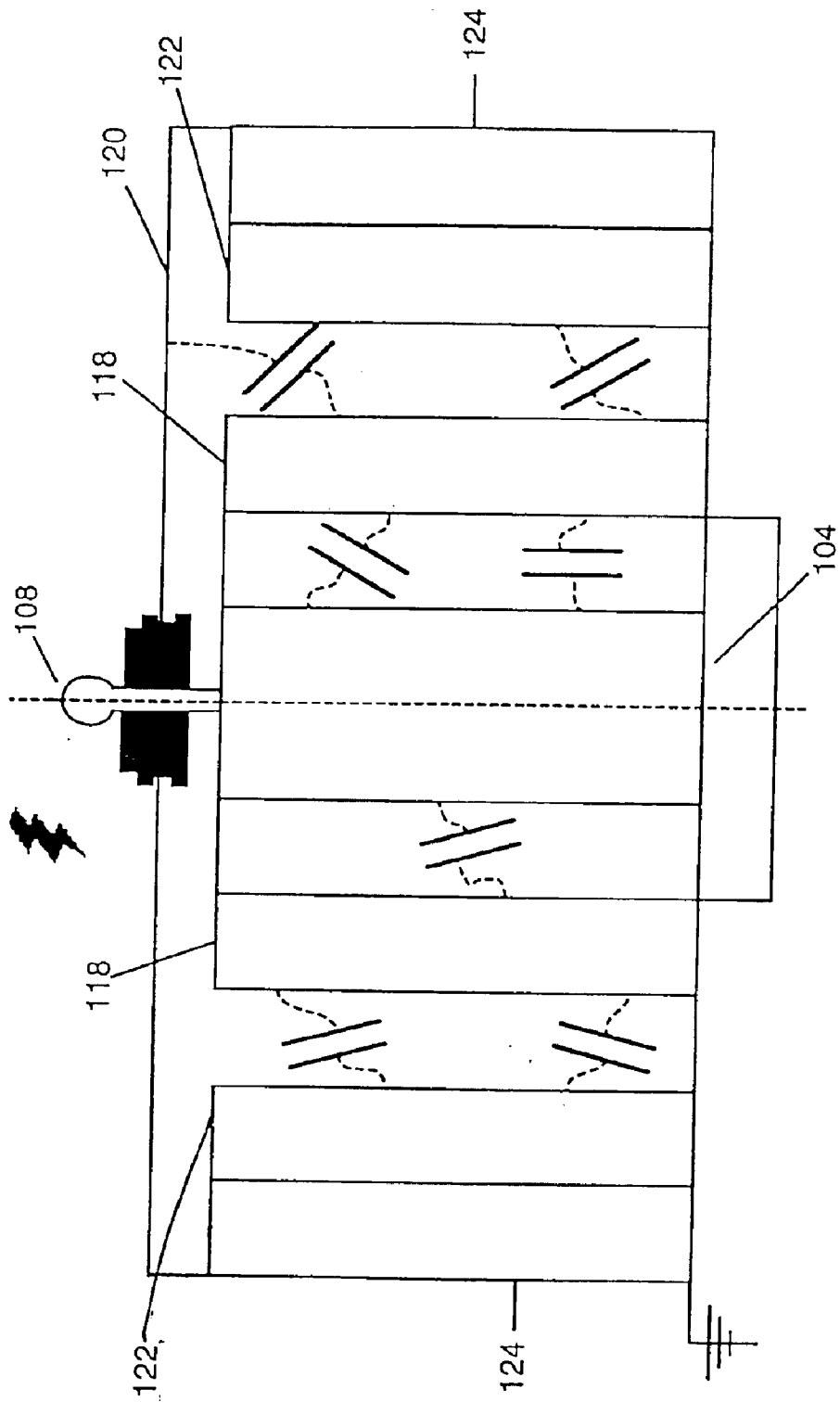
FIG. 9 illustrates a voltage divider according to another embodiment of the invention.

FIG. 9 illustrates an implementation of a high voltage impedance element 104 having two capacitive guards, generally similar to the embodiment of FIG. 8. The guard elements are mainly capacitive, since the voltage distribution in each guard at higher frequencies will depend on the capacitances in the circuit. The guard elements may themselves be constructed from a set of individual capacitive elements 128a, 128b . . . 128n (n arbitrary). The capacitors in the guard elements must be significantly larger than the stray capacitances to maintain an even voltage distribution. The simulations demonstrate that a 5 nF capacitor in the guard combination (inner and outer) may be sufficient to meet frequency response objectives of the invention.

Capacitors with good tolerances are required in order to produce an even voltage distribution in the guard element 118 and outer guard element 122. Therefore, in an embodiment of the invention two 10 nF, 630 V precision polypropylene capacitors with 1% tolerance may be illustratively chosen for each of the guard element 118 and outer guard element 122. The two capacitors may be series connected in order to withstand 800 V. The resulting capacitance is 5 nF. In all embodiments, individual capacitors, resistors and other components may be taken from one supply batch and mixed to compensate for production gradients. Solid copper planes on the board may be used to give a well-confined field.

A simulation may be performed for a voltage divider 102 incorporating two guards according to an embodiment of the invention. In the simulation, each of the 25 sections consists of the two individual guards with a 5 nF capacitor in parallel with a 1 GΩ resistor. As in other illustrated embodiments, the resistance of the internal divider may be illustratively selected to be 200 MΩ.

The stray capacitances per section are:

| Guard/element: | 34.3 pF/25 = 1.37 pF |
| Guard/element nested (outer) guard: | 62.3 pF/25 = 2.49 pF |
| Guard/shield: | 27.2 pF/25 = 1.09 pF |

Figure 10:
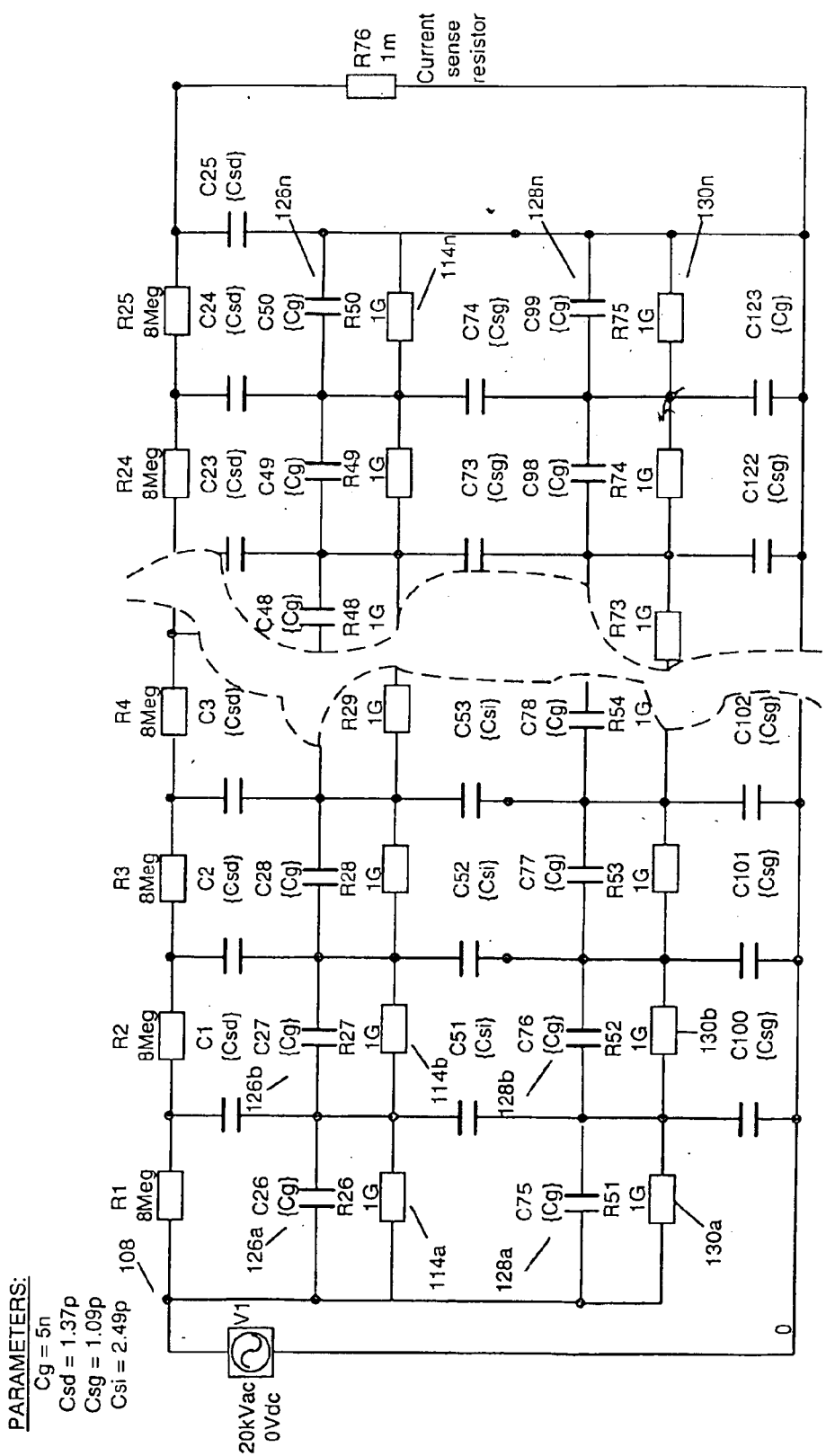
FIG. 10 illustrates a voltage divider according to another embodiment of the invention.

While the guard element 118 and outer guard element 122 are interposed for their capacitive effect, in an embodiment illustrated in FIG. 10 the guard elements may also include a resistive guard element 124 to maintain a well-defined voltage distribution at lower frequencies down to direct current. Otherwise the variation in leakage current in different capacitors may cause the voltage across some individual capacitors to exceed their maximum rating at DC. The resistive guard element 124 must have a lower resistance than the leakage resistance in the capacitors.

Since the leakage resistance in polypropylene is high, the surface leakage on the capacitor will be the dominating part.

The surface resistance may be in the range 100 GΩ–100 PΩ depending on factors including the surface contamination and humidity. Therefore any value below 10 GΩ for resistive guard element 124 may be sufficient. Like other elements, the resistive guard element 124 may likewise be constructed from multiple resistive elements 130a, 130b . . . 130n (n arbitrary). Two 100 MΩ thick film resistors may be chosen for each resistive element 130a, 130b . . . 130n of the resistive guard element 124 to reduce costs, but other types and values may be selected. The resistive guard element 124 is connected in parallel with the capacitors.

Figure 11:
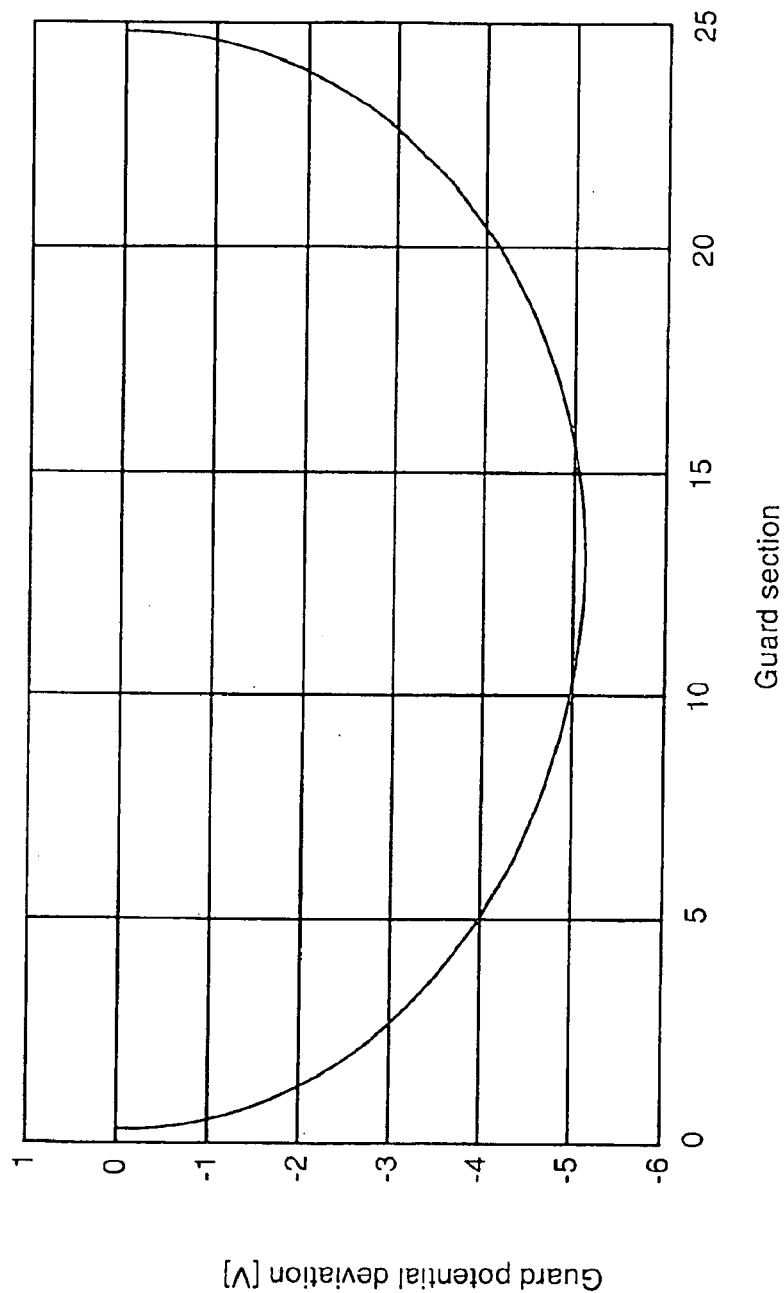
FIG. 11 illustrates a simulation of an internal drop according to an embodiment of the invention.

FIG. 11 illustrates results of the simulation of a high voltage impedance element 104 with guard element 118 and outer guard 122 in a two-guard embodiment, and including resistive guard element 124. The deviation of the potential of the guard element 118 from the ideal potential is plotted, i.e. the voltage between adjacent points on the guard element 118 and the high voltage impedance element 104.

It may be seen that the maximum voltage drop is around 5.1 V. This can be compared with the 63 V drop for the embodiment of the voltage divider 102 equipped with one guard element 118. Hence, the deviation in voltage potential is reduced by a factor of more than 10. This may be achieved even while the outer dimensions of the voltage divider 102 and the total load on the measurement instrument 116 remain the same as for the embodiment having one guard element 118. (The guard capacitance is now 2×5 nF in each section).

Figure 12:
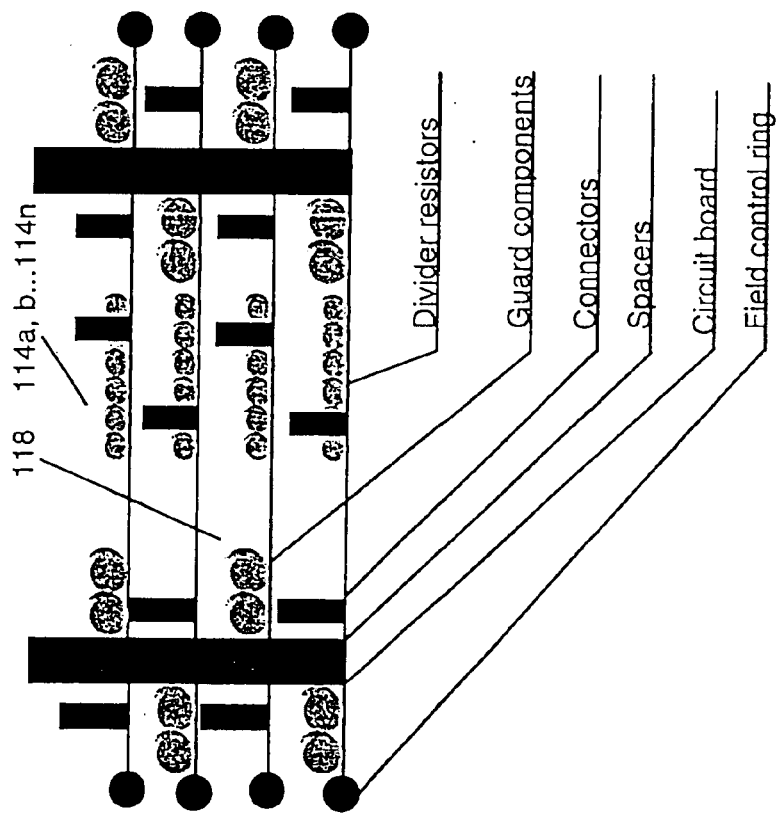
FIG. 12 illustrates a voltage divider according to another embodiment of the invention.

In an implementation of the voltage divider 102 illustrated in FIG. 12, the voltage divider 102 may incorporate an overall total of 200 axial resistors of 1 MΩ each. The high voltage impedance element 104 may be surrounded by guard element 118 and outer guard element 122 themselves consisting of multiple capacitors and resistors, resulting in at least 300 discrete components. The voltage divider 102 in this regard may be mounted on a number of printed circuit boards that are assembled to a divider stack. Printed circuit boards also provides a means of easily controlling and confining the electric fields using copper areas of different shapes. Individual boards may be assembled and stacked with plastic spacers. Small board-to-board connectors may provide connections between adjacent boards. The edge of the round circuit boards may be fitted with a field control ring to avoid partial discharges. The finished voltage divider 102 assembled from such divider stacks may be mounted inside a shielded tube, acting as shield 120, and mounted in a bushing to provide a high voltage connection.

Standard FR-4 laminate may be chosen for the circuit boards, which is a glass-fiber reinforced epoxy resin board. The board thickness may be selected to 0.8 mm to reduce the weight of the divider structure while still providing structural stability. The voltage per board may be selected to 800 V, which implies that 25 circuit boards are required in order to reach a voltage range of 20 kV, such as may be useful for testing cable insulation or other purposes. 800 V will be the maximum voltage between two adjacent points in the voltage divider 102 in this illustrated embodiment, which is unlikely to cause partial discharges. Further, 800 V can be readily handled on conventional printed circuit board materials. The distance between the boards may be chosen to be 8 mm to ensure that the field strength inside the divider structure does not exceed the breakdown value of air, to avoid breakdown along the surface of the plastic or other spacers.

Figure 13:
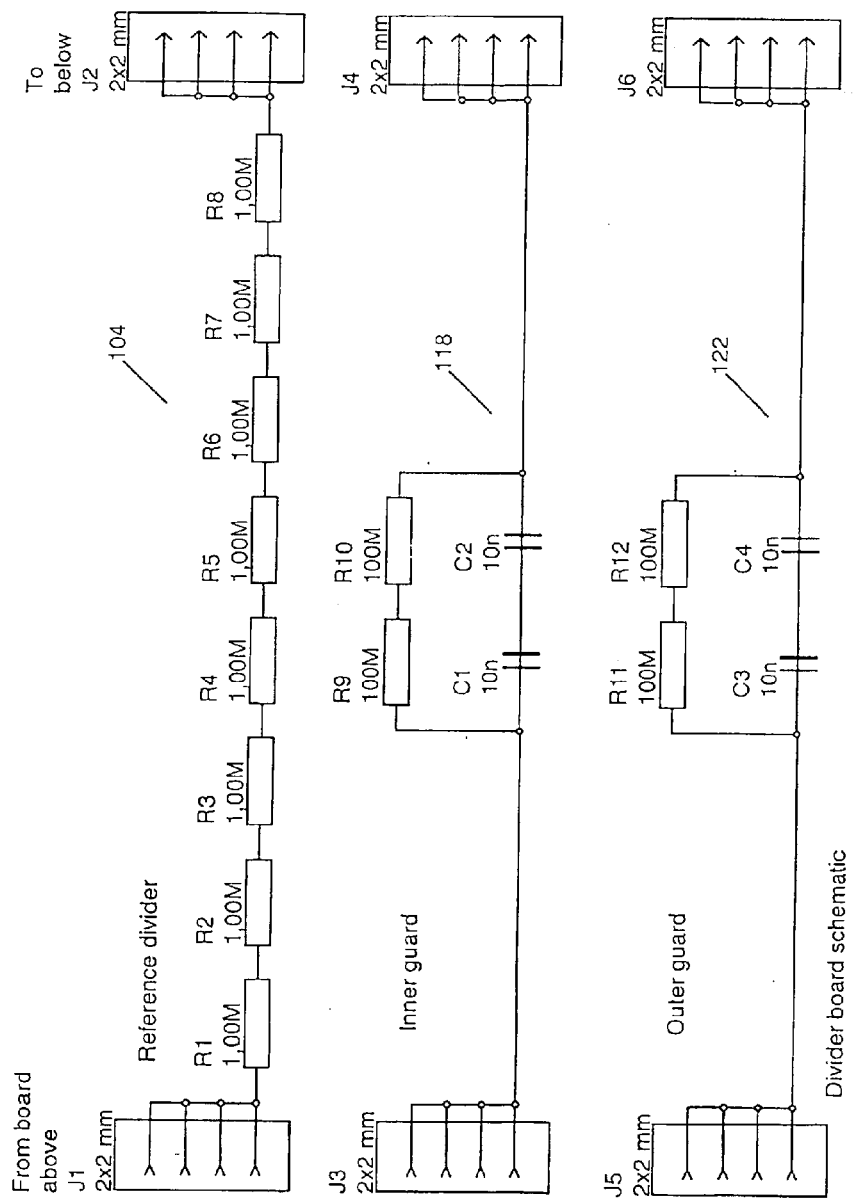
FIG. 13 illustrates a divider board assembly for use in an embodiment of the invention.

FIG. 13 illustrates a schematic of one divider board used to assemble a voltage divider 102 according to an embodiment of the invention. Gold plated four-pole connectors may be used for each connection. The four poles are connected in parallel to produce reliable contact.

Figure 14:
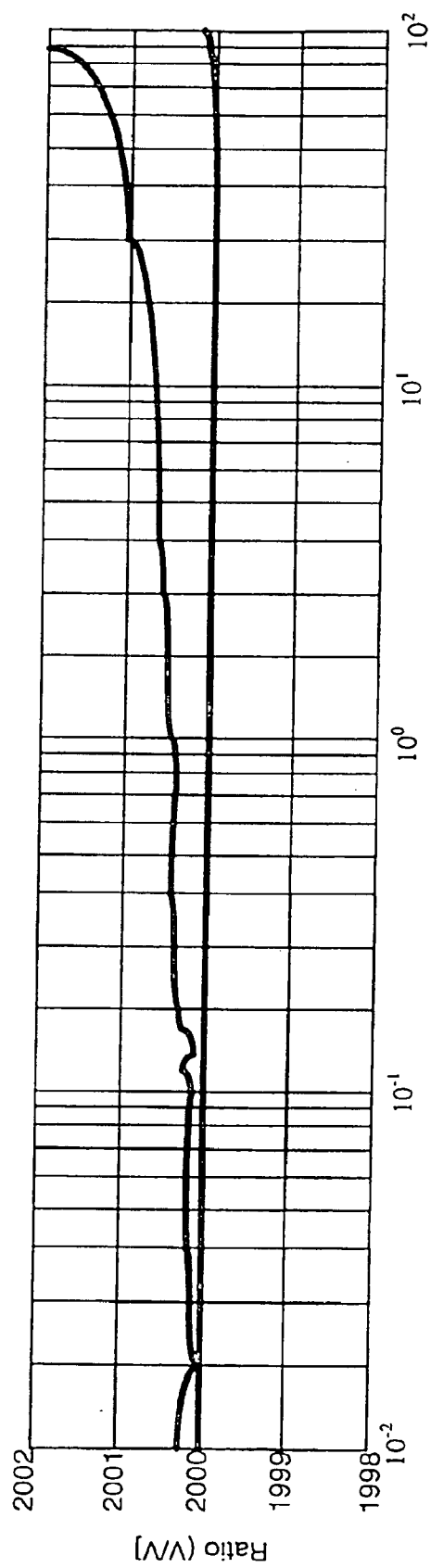
FIG. 14 illustrates a simulated and measured frequency response of a voltage divider according to an embodiment of the invention

FIG. 14 illustrates a measured frequency response of the voltage divider 102 according to an embodiment of the invention incorporating the guard element 118 and outer guard element 122. The response obtained from the simulations is also shown (upper line). It can be seen that the measured response of the voltage divider 102 differs slightly from the simulated response. However, these differences do not affect the final accuracy when the voltage divider 102 is used in a measurement system, since the response curves may be compensated for by measurement software. As noted earlier, the stability of the response of the voltage divider 102 is in any event more significant.

Figure 15:
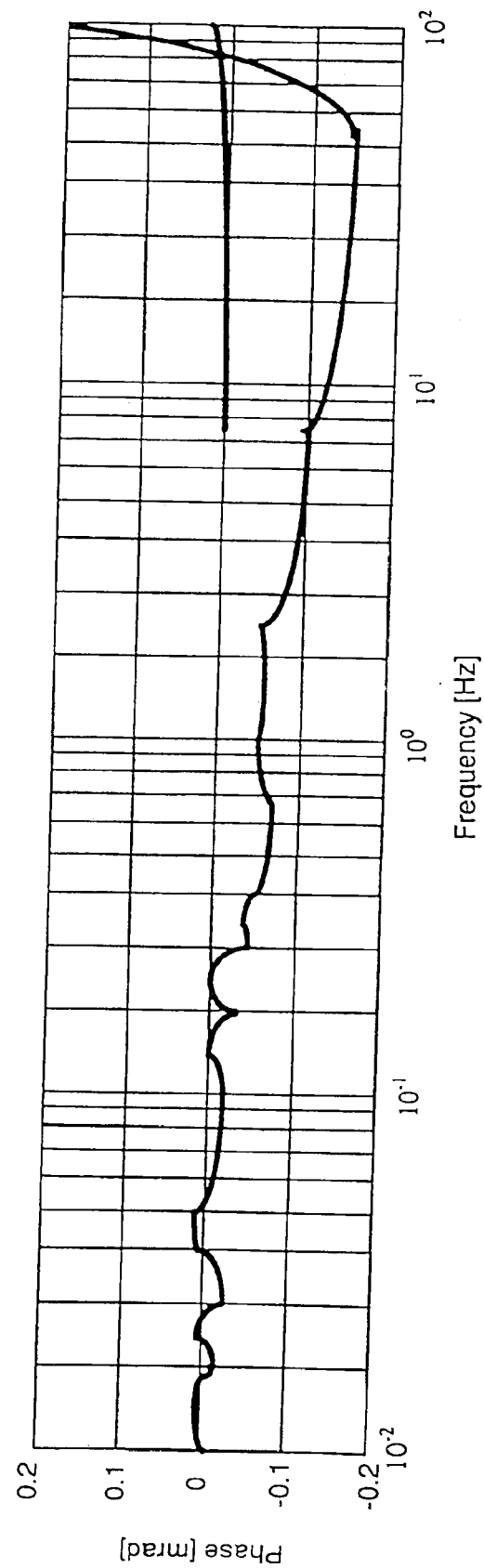
FIG. 15 illustrates a simulated and measured frequency response of a voltage divider according to an embodiment of the invention.

The difference in the phase shift illustrated in FIG. 15 may appear more significant, but since the phase shift in the high voltage impedance element 104 may be balanced out by the phase shift in the current receiver 112, the actual modeling error is small. The absolute phase shift of the voltage divider 102 and the current receiver 112 at 100 Hz is about 6 mrad, and this is modeled within an accuracy of 0.2 mrad or 3%. The measured ratio response also shows a slight difference from the simulations. At 100 Hz the voltage divider 102 nearly exactly meets the requirement of a 0.1% ratio error.

In summary, in measurements of embodiments of the invention incorporating a guard element 118 and an outer guard element 122, at least the following performance characteristics may be achieved:

TABLE 1

| Parameter | Conditions | Min | Typ | Max | Unit |
|---|---|---|---|---|---|
| Input voltage range | | | | 20 | $kV_{peak}$ |
| Input resistance | | | 200 | | MΩ |
| Input capacitance | | | 400 | | pF |
| Ratio | | | 2000 | | |
| Ratio accuracy | | −0.1 | | +0.1 | % |
| Ratio non-linearity | Full voltage range | | | 10 | ppm |
| Ratio temperature drift | | | | 5 | ppm/K |
| Ratio error due to self-heating | $U_{in}$ = 20 $kV_{peak1}$ | | | 10 | ppm |
| Ratio bandwidth | Ratio ± 0.1% | 100 | | | Hz |
| Phase shift stability | 100 μHz–100 Hz | −20 | | +20 | μrad |
| Temperature range | | 0 | | 50 | °C. |

These performance characteristics permit the voltage divider 102 according to the invention to be employed in diagnostic uses such as high voltage insulation testing and other applications where precision is needed.

Figure 16:
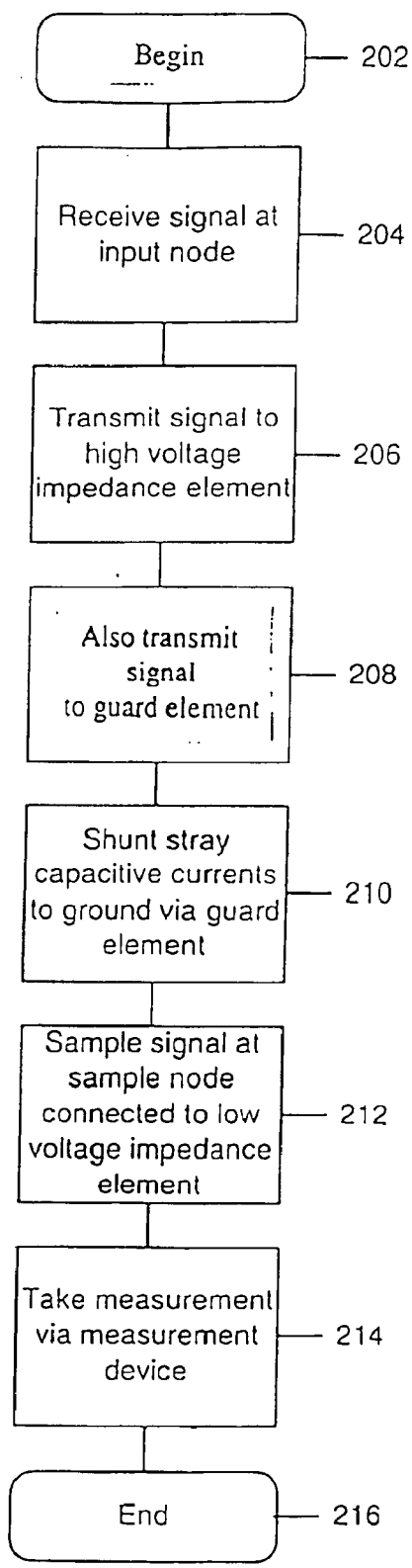
FIG. 16 illustrates a flowchart of signal processing according to an embodiment of the invention.

A flowchart of signal processing according to an embodiment of the invention is illustrated in FIG. 16. In step 202, processing begins. In step 204, a high voltage or other signal is received at input node 108. In step 206, the input signal is transmitted to the high voltage impedance element 104. In step 208, the input signal is also transmitted to the guard element 118, which surrounds and is coupled to the high voltage impedance element 104 via stray capacitances to protect frequency response and other characteristics. In step 210, stray capacitive currents may be shunted to ground via the guard element 118. In step 212, a signal appearing at the sample node 110, generally a reduced-voltage or voltage-divided signal corresponding to the original input signal at input node 108, is sampled. In step 214, measurements may be taken from the signal sampled at sample node 110 by measurement instrument 116. In step 216, processing ends.

The foregoing description of a voltage divider 102 according to the invention is illustrative, and variations in configuration and implementation will occur to persons skilled in the art. For instance, although the described application is in general for use in high-precision measurements of power line insulation using frequency domain methods, the accuracy achieved by the voltage divider 102 and associated components may be applied to other applications where a high voltage measurement with high precision and stability are required. Possible other applications may include calibration standards for DC and AC (power frequencies) measurements, as well as a high accuracy power (watt) meter.

Similarly, while the invention has been described in embodiments in terms of a cylindrical coaxial construction, other geometric and circuit configurations as possible. While the elements have been described in terms of selected capacitor and resistor parts, other types of electronic components could be used. Yet further, while the invention has been described in terms of embodiments having one or two guard elements, in other embodiments three of more guard elements may be used. The scope of the invention is accordingly intended to be limited only by the following claims.

What is claimed is:

1. A voltage divider system (102), comprising:
   a high voltage impedance element (104), connected to an input node for receiving an input signal;
   a low voltage impedance element (106), connected to the high voltage impedance element (104);
   at least one guard element (118), the at least one guard element (118) being coupled between the high voltage impedance element (104) and ground;
   wherein the at least one guard element (118) comprises at least one capacitive element; and
   wherein the at least one guard element (118) further comprises at least one resistive guard element (124) coupled to the at least one capacitive element.

2. The system of claim 1, further comprising a sample node (110) between the high voltage impedance element (104) and the low voltage impedance element (106) for sampling a -reduced voltage representation of the input signal.

3. The system of claim 2, wherein the sample node (110) is connected to a measurement device (116) to perform the sampling.

4. The system of claim 3, wherein the measurement device (116) samples at least one of voltage, current, frequency, and phase.

5. The system of claim 1, wherein the high voltage impedance element (104) comprises at least one resistive element.

6. The system of claim 5, wherein the at least one resistive element comprises at least one resistor.

7. The system of claim 6, wherein the at least one resistor comprises a plurality of resistors.

8. The system of claim 1, wherein the at least one capacitive element comprises at least one capacitors.

9. The system of claim 8, wherein the at least one capacitor comprises a plurality of capacitors.

10. The system of claim 9, wherein the at least two guard element (118)s comprise three or more guard elements.

11. The system of claim 1, wherein the at least one guard element (118) comprises at least two guard elements.

12. The system of claim 1, wherein the at least one resistive guard element (124) comprises at least one resistor coupled to the at least one capacitive element.

13. The system of claim 1, wherein the at least one resistive guard element (124) increases a stability of a voltage drop across the high voltage impedance element (104).

14. The system of claim 1, wherein the at least one guard element (118) is coaxially mounted around the high voltage impedance element (104).

15. The system of claim 1, wherein the at least one guard element (118) shunts stray capacitive currents to ground.

16. The system of claim 13, wherein the shunted stray capacitive currents stabilize a frequency response of the voltage divider (102).

17. The system of claim 1, wherein the system is mounted on a plurality of circuit boards assembled to a divider stack;
   wherein the circuit boards are spaced apart by a distance;
   wherein the edge of said circuit boards are fitted with a field control ring to avoid partial discharges; and
   wherein said divider stack is mounted inside a shielded rube and mounted in a bushing to provide a high voltage connection.

18. The system of claim 1, wherein the system is mounted on a plurality of circuit boards assembled to a divider stack;
   wherein the circuit boards are spaced apart by a distance; and
   wherein the edge of said circuit boards are fitted with a field control ring to avoid partial discharges.

19. A method for processing a signal, comprising:
   a) receiving an input signal via an input node (108) connected to a high voltage impedance element (104);
   b) communicating a reduced voltage representation of the input signal from the high voltage impedance element (104) to a low voltage impedance element (106);
   c) coupling at least one guard element (118) between the high voltage impedance element (104) and ground;
   wherein the guard element (118) comprises at least one capacitive element; and
   wherein the at least one guard element (118) further comprises at least one resistive guard element (124), further comprising a step of d) coupling the at least one resistive guard element (124) to the at least one capacitive element.

20. The method of claim 18, further comprising a step of e) sampling the reduced voltage representation of the input signal at a sample node (110) between the high voltage impedance element (104) and the low voltage impedance element (106).

21. The method of claim 20, further comprising a step of f) connecting a measurement device (116) to the sample node (110) to perform the sampling.

22. The method of claim 21, further comprising a step of g) sampling at least one of voltage, current, frequency, and phase in the measurement device (116).

23. The method of claim 19, wherein the high voltage impedance element (104) comprises at least one resistive element.

24. The method of claim 23, wherein the at least one resistive element comprises at least one resistor.

25. The method of claim 24, wherein the at least one resistor comprises a plurality of resistors.

26. The method of claim 19, wherein the at least one capacitive element comprises at least one capacitor.

27. The method of claim 26, wherein the at least one capacitor comprises a plurality of capacitors.

28. The method of claim 19, wherein the at least one guard element (118) comprises at least two guard elements.

29. The method of claim 28 wherein the at least two guard element (118)s comprise three or more guard elements.

30. The method of claim 19, wherein the at least one resistive guard element (124) comprises at least one resistor coupled to the at least one capacitive element.

31. The method of claim 19, wherein the at least one resistive guard element (124) increases a stability of a voltage drop across the high voltage impedance element (104).

32. The method of claim 19, wherein the at least one guard element (118) is coaxially mounted around the high voltage impedance element (104).

33. The method of claim 19, further comprising a step of h) shunting stray capacitive currents to ground via the at least one guard element (118).

34. The method of claim 33, wherein the shunted stray capacitive currents stabilize a frequency response.

35. A voltage divider system, comprising:
high voltage impedance means (104), connected to an input node for receiving an input signal;
low voltage impedance means (106), connected to the high voltage impedance means (104);
at least one guard means (118), the at least one guard means (118) being coupled between the high voltage impedance means (104) and ground;
wherein the at least one guard means (118) comprises at least one capacitive element; and
wherein the at least one guard means (118) further comprises at least one resistive guard means (124) coupled to the at least one capacitive element.

36. The system of claim 35, further comprising a sample node (110) between the high voltage impedance means (104) and the low voltage impedance means (106) for sampling a -reduced voltage representation of the input signal.

37. The system of claim 36, wherein the sample node (110) is connected to a measurement means (116) to perform the sampling.

38. The system of claim 37, wherein the measurement means (116) samples at least one of voltage, current, frequency, and phase.

39. The system of claim 35, wherein the high voltage impedance means (104) comprises at least one resistive element.

40. The system of claim 39, wherein the at least one resistive element comprises at least one resistor.

41. The system of claim 40, wherein the at least one resistor comprises a plurality of resistors.

42. The system of claim 35, wherein the at least one capacitive element comprises at least one capacitor.

43. The system of claim 42, wherein the at least one capacitor comprises a plurality of capacitors.

44. The system of claim 35, wherein the at least one guard means (118) comprises at least two guard means.

45. The system of claim 44, wherein the at least two guard means comprise three or more guard means.

46. The system of claim 35, wherein the at least one resistive guard means comprises at least one resistor coupled to the at least one capacitive element.

47. The system of claim 35, wherein the at least one resistive guard means (124) increases a stability of a voltage drop across the high voltage impedance element (104).

48. The system of claim 35, wherein the at least one guard means (118) is coaxially mounted around the high voltage impedance means (104).

49. The system of claim 35, wherein the at least one guard means (118) shunts stray capacitive currents to ground.

50. The system of claim 49, wherein the shunted stray capacitive currents stabilize a frequency response of the voltage divider (102).

51. The system of claim 35, wherein the system is mounted on a plurality of circuit boards assembled to a divider stack;
wherein the circuit boards are spaced apart by a distance;
wherein the edge of said circuit boards are fitted with a field control ring to avoid partial discharges; and
wherein said divider stack is mounted inside a shielded rube and mounted in a bushing to provide a high voltage connection.

52. The system of claim 35, wherein the system is mounted on a plurality of circuit boards assembled to a divider stack;
wherein the circuit boards are spaced apart by a distance; and
wherein the edge of said circuit boards are fitted with a field control ring to avoid partial discharges.

53. A voltage divider (102), comprising:
a plurality of series-connected high voltage resistors (114a, 14b . . . 114n), the series-connected high voltage resistors (114a, 114b . . . 114n) connected to an input node (110) for receiving an input signal;
at least one low voltage resistive element (106), the at least one low voltage resistive element (106) connected to the series-connected high voltage resistors (114a, 114b . . . 114n);
at least one capacitive guard (118), the at least one capacitive guard (118) connected between the series-connected high voltage resistors (114a, 114b . . . 114n) and ground; and
wherein at least one capacitive guard (118) further comprises at least one resistive guard (124) coupled to the at least one capacitive guard (118).

54. The voltage divider of claim 53, wherein the at least one capacitive guard (118) comprises a plurality of capacitors.

55. The voltage divider of claim 53, wherein the at least one capacitive guard (118) comprises at least two capacitive guards.

56. The voltage divider of claim 55, wherein the at least two capacitive guards comprise three or more capacitive guards.

57. The voltage divider of claim 53, wherein the at least one resistive guard (124) comprises at least one resistor coupled to the at least one capacitive guard (118).

58. The voltage divider of claim 53, wherein the at least one resistive guard (124) increases a stability of a voltage drop across the series-connected high voltage resistors (114a, 114b . . . 114n).

59. The voltage divider of claim 53, wherein the at least one capacitive guard (118) shunts stray capacitive current to ground.

60. The voltage divider of claim 59, wherein the shunted stray capacitive currents stabilize a frequency response of the voltage divider (102).

* * * * *

UNITED STATES PATENT AND TRADEMARK OFFICE
CERTIFICATE OF CORRECTION

PATENT NO. : 6,909,272 B2
APPLICATION NO. : 09/987991
DATED : June 21, 2005
INVENTOR(S) : Bjorn Bengtsson Page 1 of 1

It is certified that error appears in the above-identified patent and that said Letters Patent is hereby corrected as shown below:

Col. 9, line 58: replace "capacitors" with --capacitor--;

Col. 10, line 10: replace "13" with --15--;

Col. 10, line 19: replace "rube" with --tube--;

Col. 10, line 44: replace "18" with --19--;

Col. 12, line 14: replace "rube" with --tube--;

Col. 12, line 26: replace "14b" with --114b--.

Signed and Sealed this

Seventeenth Day of October, 2006

JON W. DUDAS
*Director of the United States Patent and Trademark Office*